United States Patent
Kadomatsu

(10) Patent No.: US 8,181,075 B2
(45) Date of Patent: May 15, 2012

(54) ERROR CORRECTION DEVICE AND RECORDING AND REPRODUCING DEVICE

(75) Inventor: Teruhiro Kadomatsu, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 1211 days.

(21) Appl. No.: 11/984,629

(22) Filed: Nov. 20, 2007

(65) Prior Publication Data

US 2008/0155370 A1    Jun. 26, 2008

(30) Foreign Application Priority Data

Dec. 26, 2006    (JP) .................................. 2006-348798

(51) Int. Cl.
*G06F 11/00* (2006.01)
*G11B 20/10* (2006.01)

(52) U.S. Cl. ...................... 714/746; 369/47.1

(58) Field of Classification Search .................. 714/747, 714/799, 718, 722, 746, 784, 781, 719, 819; 365/201, 230.03; 369/47.1
See application file for complete search history.

(56) References Cited

U.S. PATENT DOCUMENTS

| | | | | | |
|---|---|---|---|---|---|
| 4,931,968 | A | * | 6/1990 | Hirose | 250/363.07 |
| 4,949,342 | A | * | 8/1990 | Shimbo et al. | 714/769 |
| 7,099,190 | B2 | * | 8/2006 | Noguchi et al. | 365/185.09 |
| 7,453,728 | B2 | * | 11/2008 | Noguchi et al. | 365/185.09 |

FOREIGN PATENT DOCUMENTS

| | | |
|---|---|---|
| JP | 2001-143408 A | 5/2001 |
| JP | 2003-177973 A | 6/2003 |

OTHER PUBLICATIONS

The Illustrated DVD Reader, Chapter 3.2.5 Decoding of Error Correction Code, Ohmsha, Ltd., ISBN 4-274-03606-5, 2003, pp. 106-109.

* cited by examiner

*Primary Examiner* — Phung M Chung
(74) *Attorney, Agent, or Firm* — Foley & Lardner LLP

(57) ABSTRACT

An error correction device is a device detecting and correcting an error of uncorrected data. The error correction device includes a temporary storage buffer (data buffer) having a storage area divided into a plurality of units and storing the uncorrected data divided into storage area units, and an error correction part (error correction circuit) repeatedly performing detecting an error of the uncorrected data stored in the temporary storage buffer, correcting the detected error, and writing the corrected error into the temporary storage buffer for each storage area unit. The error correction part corrects the error of the uncorrected data for storage area unit of the temporary storage buffer to successively write the corrected data into the temporary storage buffer.

5 Claims, 6 Drawing Sheets

ERROR CORRECTION DEVICE AND RECORDING AND REPRODUCING DEVICE

BACKGROUND OF THE INVENTION

1. Field of the Invention

The present invention relates to an error correction device, and, more specifically, to an error correction device storing a corrected data in a data buffer composed of a plurality of storage areas.

2. Description of Related Art

Development of a recording media having high capacity has recently been accelerated due to the Blu-ray standard and HD DVD (High-Definition Digital Versatile Disc) standard. In some DVD disc devices, there is a need to process a large amount of data at high speed. For example, a configuration in which a technique disclosed in Japanese Unexamined Patent Application Publication No. 2001-143408 is applied to a DVD/CD (Digital Versatile Disc/Compact Disc) disc device will be shown in FIGS. 3 and 4. FIG. 5 shows a data format of ECC (error check and correct) block of the DVD.

FIG. 3 is a block diagram showing an example of an overall structure of the DVD/CD disc device according to a background art. Data processing when the DVD disc is reproduced will be described hereinafter. As shown in FIG. 3, a DVD/CD disc device 200 includes a CPU (Central Processing Unit) 202, a pickup 203, a read/write channel 204, a HOST I/F 206, a buffer control circuit 207, a format control circuit 208, a data buffer 209, and an error correction circuit 300.

The CPU 202 controls the whole DVD/CD disc device. The pickup 203 reads data (uncorrected data) from the DVD disc and transmits the data to the read/write channel 204. The read/write channel 204 demodulates the data and transmits the data to the format control circuit 208. The format control circuit 208 processes the data according to the disc format that is different between discs. The data that is processed at the format control circuit 208 is transmitted to the error correction circuit 300.

In DVD for example, the data is processed to have 182 bytes*208 rows, as shown in FIG. 5. The data having 182 bytes*208 rows is called ECC block and the error correction process of the DVD is performed in this ECC block unit. The data from 173-rd byte to 182-nd byte of each row is called PI and the data from 193-rd row to 208-th row of the ECC block is called PO. PO and PI are called ECC code and the data from 172 bytes*192 rows, which is the data excluding the ECC code, is main data.

The HOST I/F 206 uses the corrected data. The HOST I/F 206 accesses the corrected data stored in the data buffer 209 through the buffer control circuit 207.

The buffer control circuit 207 is the circuit controlling reading/writing the data from/to the data buffer 209.

The data buffer 209 is configured by SDRAM (Synchronous Dynamic Random Access Memory) (for example EDS1216AGTA: made by Elpida Memory, Inc). The data buffer 209 temporarily stores the data which is now being corrected and has a capacity of 128 megabytes. Note that the SDRAM is composed of a plurality of storage areas called page and continuous access is possible in the same page, which makes it possible to improve process speed.

The error correction circuit 300 includes a PI correction circuit 301, a decoder 302, and a restoration part 303.

The PI correction circuit 301 is the circuit that performs a first correction in a PI direction (182 bytes in one row) shown in FIG. 5 by one row unit.

The decoder 302 is the circuit generating error correction code and error position information of the error data in the ECC block. The error correction code is described in "The Illustrated DVD Reader, Chapter 3.2.5 Decoding of Error Correction Code", Ohmsha, Ltd., ISBN 4-274-03606-5, p. 106-109.

The restoration part 303 is the circuit for rewriting data stored in the data buffer 209 according to the generated error position information and error correction code.

Now, a operation of the error correction circuit 300 according to the background art will be described with reference to FIG. 4. FIG. 4 is a block diagram showing one example of a configuration of the error correction circuit according to the background art. The error correction circuit 300 shown in FIG. 4 includes the PI correction circuit 301, the decoder 302, and a restoration part 307.

The data processed by the format control circuit 208 is input to the PI correction circuit 301. The PI correction circuit 301 performs the first correction in the PI direction (182 bytes in one row) by one row unit. The PI direction is shown in the data format of the ECC block of the DVD in FIG. 5. Then the PI correction circuit 301 transmits the data excluding the ECC code to the data buffer 209 through the buffer control circuit 207 by ECC block unit (1ECC).

The number of pages needed to store the data for 1ECC in the data buffer 209 can be calculated by dividing the data for 1ECC by the number of bytes in one page. Specifically, the data length excluding the ECC code is 172 bytes*192 rows and capacity for one page is 1024 bytes. Therefore, the number of pages is 33 pages as shown in equation 1.

$$172 \text{ bytes} * 192 \text{ rows} / 1024 \text{ bytes} = 32.24 \text{ pages} \qquad (\text{eq. 1})$$

One buffer for PO correction and one buffer for PI correction are allocated to one page on the data buffer 209 to facilitate transferring of the data to the SDRAM. Therefore, the buffers for PO correction 309-1 to 309-33 and the buffers for PI correction 312-1 to 312-33 are needed to be provided for 1ECC.

The data on which the first correction is performed by the PI correction circuit 301 is also transmitted to the decoder 302 by ECC block unit. The transmitted data includes the ECC code. The decoder 302 includes a PO operation circuit 310, a PI operation circuit 304, and an error polynomial operation circuit 320.

The PO operation circuit 310 performs a syndrome calculation in a PO direction (192 rows in a vertical direction) shown in FIG. 5 on each column of the input ECC block and stores the calculation result for 182 columns. After the PO syndrome calculation for 1ECC is completed, the PO operation circuit 310 transmits the calculated data to the error polynomial operation circuit 320. The error polynomial operation circuit 320 generates the error position information and the error correction code.

The PI operation circuit 304 performs the syndrome calculation in the PI direction (182 bytes in a horizontal direction) shown in FIG. 5 on each row of the input ECC block and stores the calculation result for 192 rows for a second PI correction process. The error correction code and the error position information in the ECC block generated by the error polynomial operation circuit 320 are transmitted to an error address operation selection circuit 305 in the restoration part 307.

The restoration part 307 includes the error address operation selection circuit 305, a page size register 306, an address offset register 308, buffers for PO correction 309-1 to 309-33, buffers for PI correction 312-1 to 312-33, an EXOR circuit 317, a buffer for corrected data 316, and a buffer access control circuit 315.

The page size register 306 stores the data indicating one page size of the data buffer 209.

The address offset register 308 stores the address on the data buffer 209, which is the leading address of the corrected data that is to be processed.

The error address operation selection circuit 305 determines where in the buffers for PO correction 309-1 to 309-33 the error position information in 1ECC block is stored based on the data of the address offset register 308 and the data of the page size register 306. Then the error address operation selection circuit 305 stores the error correction code and the address on the data buffer 209 in which the corresponding data is stored in the buffers for PO correction 309-1 to 309-33. The restoration part 307 stores the error correction code for 1ECC and the address on the data buffer 209 in the buffers for PO correction 309-1 to 309-33. Then the restoration part 307 rewrites the data stored in the data buffer 209.

The restoration part 307 reads out the address on the data buffer 209 stored in the buffer for PO correction 309-1 and reads out the data of the data buffer 209 designated by the address. The exclusive-OR operation is performed on the data that is read out and the error correction code data held by the buffer for PO correction 309-1 by the EXOR circuit 317 and the operation result is stored in the buffer for corrected data 316. After all the data held by the buffer for PO correction 309-1 are processed, the restoration part 307 writes back the data stored in the buffer for corrected data 316 to the data buffer 209.

After writing back the data, the restoration part 307 successively performs the same process on the buffers for PO correction 309-2 to 309-33. When processing of 33 buffers for PO correction has completed, the error correction in the PO direction for 1ECC is completed. The restoration part 307 performs the error correction in the PI direction again after the error correction in the PO direction is completed.

When the PO corrected data is written back to the data buffer 209, the corrected data is also transmitted to the PI operation circuit 304. The PI operation circuit 304 compensates the operation result stored in the PI operation circuit 304 based on the PO corrected data. After all the operation result is compensated, the PI operation circuit 304 transmits the corrected syndrome calculation result to the error polynomial operation circuit 320. Then the error polynomial operation circuit 320 generates the error correction code and the error position information in 1ECC block. The generated error correction code and the error position information in 1ECC block are transmitted to the error address operation selection circuit 305.

The error address operation selection circuit 305 determines where in the buffers for PI correction 312-1 to 312-33 the error position information in 1ECC block is stored based on the data of the address offset register 308 and the data of the page size register 306. Then the error address operation selection circuit 305 stores the error correction code and the address on the data buffer 209 in which the corresponding data is stored in the buffers for PI correction 312-1 to 312-33.

Then the restoration part 307 rewrites the data stored in the data buffer 209. The address on the data buffer 209 stored in the buffer for PI correction 312-1 is read out and the data of the data buffer 209 designated by the address is read out. The exclusive-OR operation is performed on the data that is read out and the error correction code data stored in the buffer for PI correction 312-1 by the EXOR circuit 317. The operation result is stored in the buffer for corrected data 316. After all the data stored in the buffer for PI correction 312-1 are processed, the data stored in the buffer for corrected data 316 is written back to the data buffer 209.

After writing back the data, the restoration part 307 successively performs the same process on the buffers for PI correction 312-2 to 312-33. When processing of 33 buffers for PI correction has completed, the error correction in the PI direction is completed. The error correction process of the data of 1ECC block is thus completed.

Now, a data flow will be described with reference to FIG. 6. FIG. 6 is a timing chart of the error correction process according to the background art. T0 to T5 indicate time. After PI correction is performed on the data input from the format control circuit 208 to the PI correction circuit 301, the PI corrected data is transmitted to the PO operation circuit 310, the PI operation circuit 304, and the buffer control circuit 207 (401, 402, 403). After the data for 1ECC is transmitted, the operation result obtained from the PO operation circuit 310 is input to the error polynomial operation circuit 320 (404). The error correction code and the error position information in 1ECC block generated at the error polynomial operation circuit 320 are input to the error address operation selection circuit 305 (405).

It is determined by the error address operation selection circuit 305 where in the buffers for PO correction 309-1 to 309-33 the error position information and the error correction code are stored. Then the error position information and the error correction code are stored in the determined buffer for PO correction (406). When the error position information for 1ECC is stored in the buffers for PO correction 309-1 to 309-33, the restoration part 307 reads out the error correction code and the address on the data buffer 209 successively from the buffer for PO correction 309-1 and rewrites the data stored in the data buffer 209 through a data buffer rewriting bus (buffer control circuit 207) (407). The rewritten data is also transmitted to the PI operation circuit 304 (408).

The operation result is compensated using the rewritten data in the PI operation circuit 304. When the rewriting of the buffers for PO correction 309-1 to 309-33 is completed, the PI operation circuit 304 inputs the compensated operation result to the error polynomial operation circuit 320 (409). The error correction code and the error position information in the 1ECC block generated at the error polynomial operation circuit 320 are input to the error address operation selection circuit 305. It is determined by the error address operation selection circuit 305 where in the buffers for PI correction 312-1 to 312-33 the error position information and the error correction code are stored. Then the error position information and the error correction code are stored in the determined buffer for PI correction (410).

When the error position information for 1ECC is stored in the buffers for PI correction 312-1 to 312-33, the error correction code and the address on the data buffer 209 are read out successively from the buffer for PI correction 312-1 and the data stored in the data buffer 209 is rewritten (411). When rewriting of the data stored in the data buffer 209 is completed to the buffer for PI correction 312-33, the correction process for 1ECC is completed.

The PI correction process for the last data is completed when the process for rewriting of the data buffer 209 for 33 pages is completed (413) after the last error position information and the error correction code are transmitted from the error polynomial operation circuit 320 (412).

However, in the background art, the data held by the data buffer 209 is rewritten after the error detection process for 1ECC is completed and after the error correction code and the address on the data buffer 209 indicating the error correction code are stored in the buffers for PO correction 309-1 to 309-33 and the buffers for PI correction 312-1 to 312-33. Further, in rewriting the data held by the data buffer 209, the data is written back to the data buffer 209 after being stored in the dedicated buffer for corrected data 316 when the data, obtained by performing exclusive-OR operation on the data held by the buffers for PO correction 309-1 to 309-33 or the buffers for PI correction 312-1 to 312-33 (error correction code) and the data held by the data buffer 209 (data that is to be corrected), is temporarily stored.

Therefore, 33 buffers for PO correction and the 33 buffers for PI correction are needed to store the error data for 1ECC. The dedicated buffer for corrected data 316 is also needed. Therefore, the area of the error correction circuit 300 is large in the background art. In the background error correction circuit, the buffer capacity needed for error correction process and the area of the error correction circuit are large.

SUMMARY

According to one aspect of the present invention, there is provided an error correction device including a temporary storage buffer and an error correction part. The temporary storage buffer includes a storage area divided into a plurality of units and stores uncorrected data divided into storage area units. The error correction part detects an error of the uncorrected data stored in the temporary storage buffer, corrects the detected error, and writes the corrected data into the temporary storage buffer for each storage area unit. The error correction part repeats detecting, correcting and writing for the uncorrected data stored in each storage area. As stated above, the error correction part corrects the error of the uncorrected data for each storage area unit of the temporary storage buffer to successively write the corrected data into the temporary storage buffer. Therefore, the corrected data of a capacity of storage area unit is kept to be held until the corrected data is written into the temporary storage buffer. Therefore, only two buffers are required. One buffer is used in an error correction process, and the other buffer is used for storing the corrected data of the capacity of storage area unit. In a background art, the corrected data is collectively written into the temporary storage buffer after the data is corrected. Therefore, another buffer holding the corrected data (for example, corrected data of 1ECC block) is required in the background art. According to the present invention, it is possible to reduce the capacity of the buffer storing the corrected data and to decrease the area of a semiconductor chip.

According to the present invention, it is possible to rewrite the corrected data by storage area unit (access unit) of the temporary storage buffer (data buffer) that temporarily stores the corrected data. This makes it possible to reduce buffer capacity that is needed for error correction process.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

Figure 1:
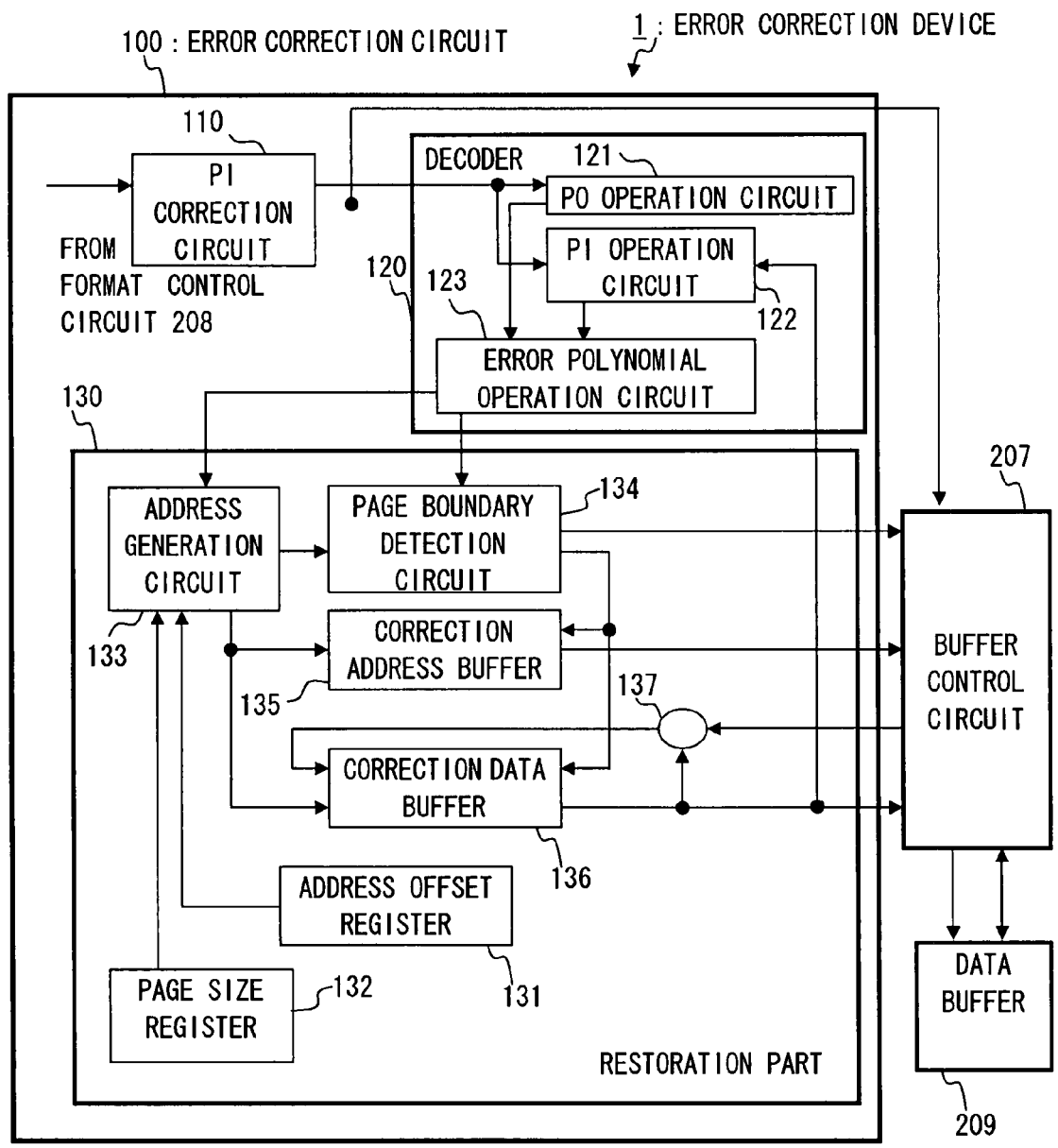
FIG. 1 is a block diagram showing a configuration example of an error correction circuit according to a first embodiment of the present invention.

The invention will now be described herein with reference to illustrative embodiments. Those skilled in the art will recognize that many alternative embodiments can be accomplished using the teachings of the present invention and that the invention is not limited to the embodiments illustrated for explanatory purposes.

The embodiment of the present invention will now be described with reference to the drawings. The same reference numerals are given to the same components in each diagram and detailed description thereof will be omitted.

First Embodiment

Figure 3:
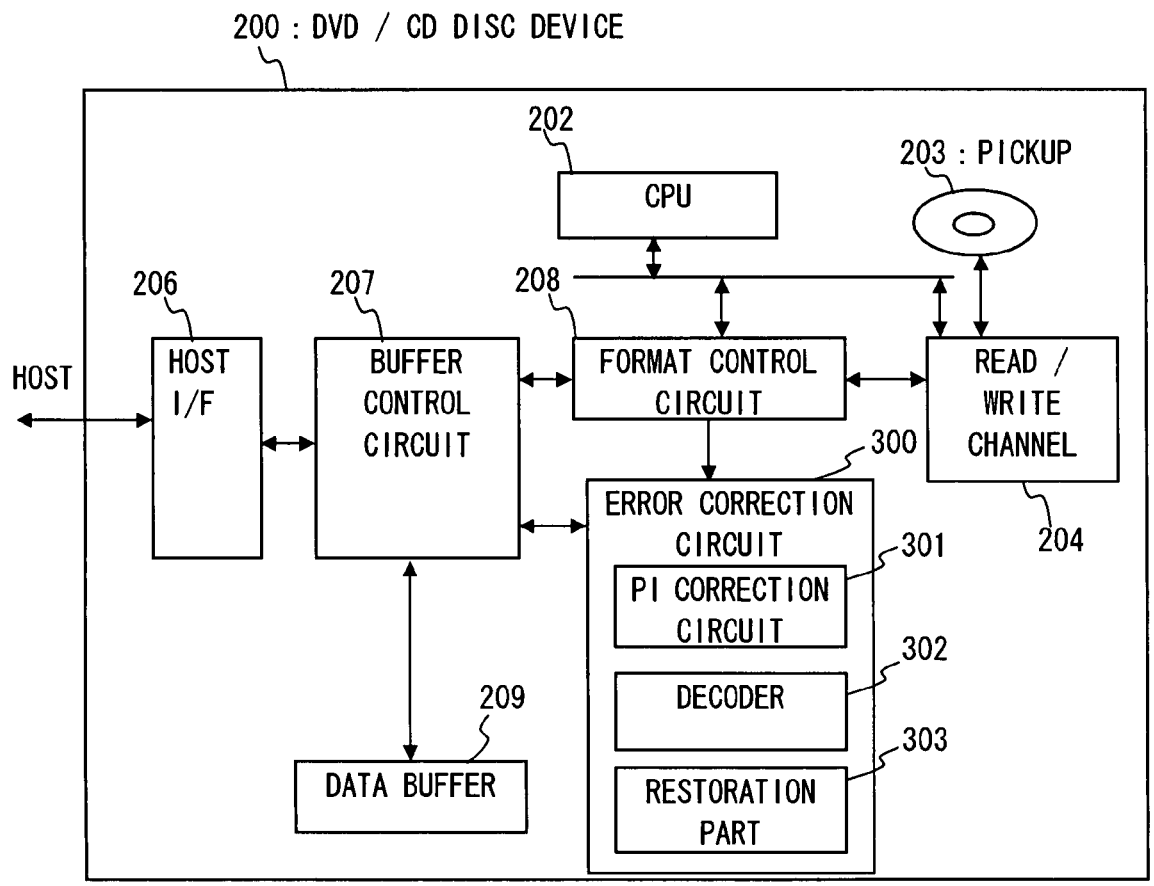
FIG. 3 is a block diagram showing an example of a whole configuration of a DVD/CD disc device.

FIG. 1 is a block diagram showing a configuration example of an error correction circuit according to the first embodiment of the present invention. An error correction circuit (error correction part) 100 as shown in FIG. 1 functions in a device configured in the same way as the DVD/CD disc device (recording and reproducing device) 200 shown in FIG. 3. The error correction circuit 100 may be used in place of the error correction circuit 300 included in the DVD/CD disc device 200. The error correction circuit 100 shown in FIG. 1 includes a PI correction circuit 110, a decoder (decoding part) 120, and a restoration part (reconstruction part) 130, all of which can be used in place of the PI correction circuit 301, the decoder 302, and the restoration part 307 respectively as shown in FIG. 3. Even when the error correction circuit 100 shown in FIG. 1 is mounted on the DVD/CD disc device 200, the operation of the DVD/CD disc device 200 shown in FIG. 3 is the same except the operation of the error correction circuit 300. Therefore, overlapping description is omitted here. As shown in FIG. 1, a structure including the error correction circuit 100, a buffer control circuit (temporal storage buffer) 207, and a data buffer 209 may be called error correction device 1. Each component in FIG. 1 will now be described.

Figure 5:
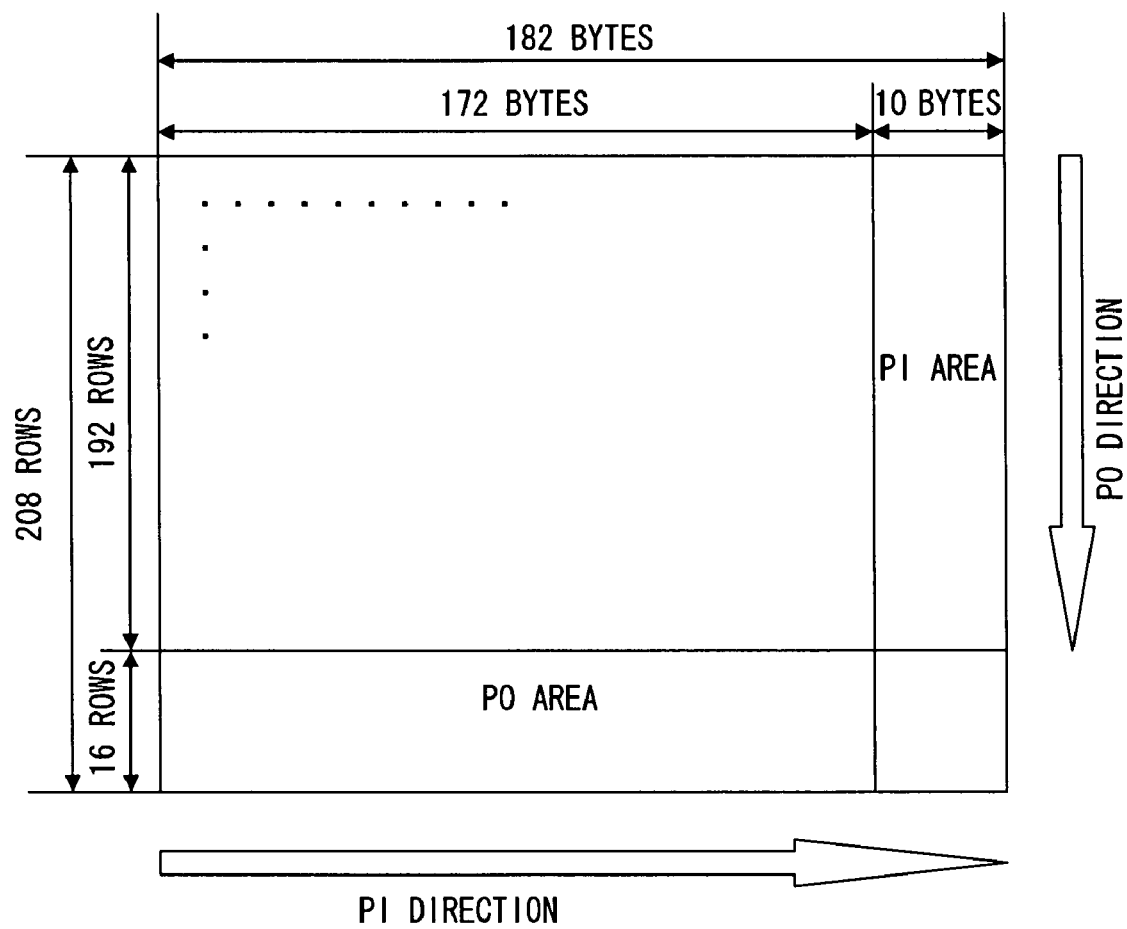
FIG. 5 is a diagram showing a data format of an ECC block of a DVD.
Figure 6:
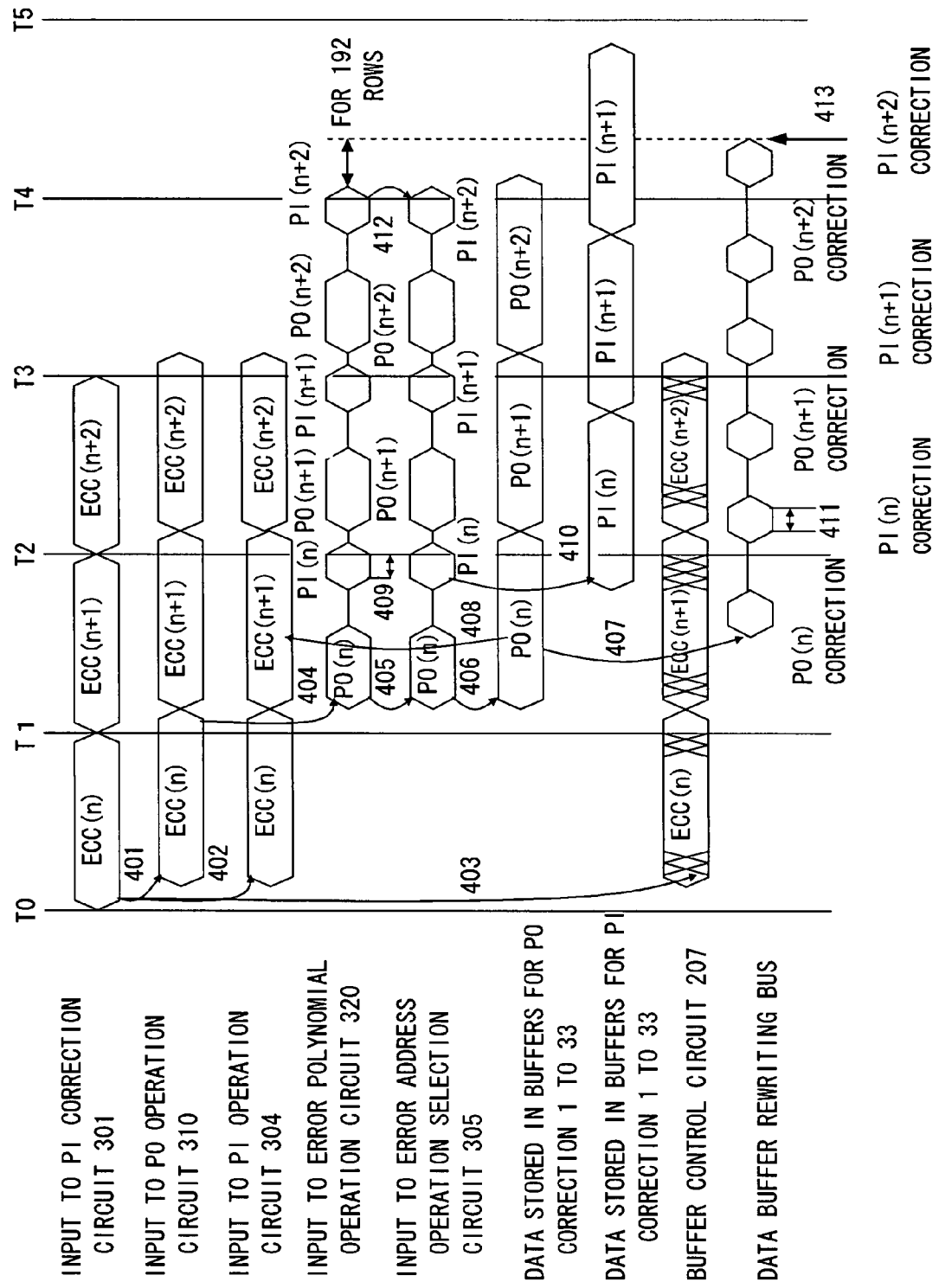
FIG. 6 is a timing chart of a background error correction process.

The PI correction circuit 110 is the circuit that performs a first correction in a PI direction (182 bytes in one row) shown in FIG. 5 on the data (uncorrected data) which is processed at a format control circuit 208 by one row unit.

The decoder 120 includes a PO operation circuit 121, a PI operation circuit 122, and an error polynomial operation circuit 123. The PO operation circuit 121 performs a syndrome calculation in a PO direction on the data corrected in the PI correction circuit 110. The PI operation circuit 122 performs a syndrome calculation in the PI direction on the data corrected in the PI correction circuit 110 and compensates the calculation result using the PO corrected data. The error polynomial operation circuit 123 generates the error correction code and the error position information in the 1ECC block from the operation result obtained by the PO operation circuit 121 and the PI operation circuit 122.

The restoration part 130 includes an address offset register 131, a page size register 132, an address generation circuit (address generation part). 133, a page boundary detection circuit (detector part) 134, a correction address buffer 135, a correction data buffer 136, and an EXOR circuit 137.

The address offset register 131 stores the address on the data buffer 209, which is the leading address of the corrected data that is to be processed.

The page size register 132 stores the data indicating one page size of the data buffer 209.

The address generation circuit 133 generates the address on the data buffer 209 in which the uncorrected data that is to be corrected is stored based on the data stored in the address offset register 131, the data stored in the page size register 132, and the error position information in the 1ECC block generated in the error polynomial operation circuit 123. The uncorrected data means the data that is to be corrected and includes the data that has already been corrected but is to be corrected again.

The page boundary detection circuit 134 detects timing in which the error of the uncorrected data stored in one page (storage area unit) is detected. In the present embodiment, the page boundary detection circuit 134 detects timing in which the error detection of the uncorrected data stored in one page of the data buffer 209 is completed. Specifically, the page boundary detection circuit 134 detects whether or not the address on the data buffer 209 generated by the address generation circuit 133 has crossed the page boundary. Then the page boundary detection circuit 134 detects timing in which the error correction code is stored in the correction data buffer 136 for the uncorrected data stored in one page of the data buffer 209.

The correction address buffer 135 stores the address on the data buffer 209 generated by the address generation circuit 133 as the error position information. The address identifies the position of the uncorrected data whose error is detected. The correction address buffer 135 at least includes the storage area storing the value of the address for two pages on the data buffer 209.

The correction data buffer 136 stores the error correction code and the corrected data, both of which corresponds to the uncorrected data corresponding to the address stored in the correction address buffer 135. The correction data buffer 136 at least includes the storage area storing the value of the address for two pages on the data buffer 209.

The EXOR circuit 137 performs the exclusive-OR operation on the value of the correction data buffer 136 and the data read by the data buffer 209.

The buffer control circuit 207 controls writing/reading the data to/from the data buffer 209. The data buffer (temporary storage buffer) 209 is composed of SDRAM, for example, and temporarily stores the data whose error is being corrected. The data buffer 209 is divided into a plurality of storage areas (pages) and can be accessed by page unit.

Now, a operation of the error correction circuit 100 according to the first embodiment of the present invention will be described with reference to FIGS. 1 and 3.

The data processed by the format control circuit 208 is input to the PI correction circuit 110 in the error correction circuit 100. The PI correction circuit 110 performs the first correction in the PI direction (182 bytes in one row) shown in FIG. 5 by one row unit. Then the PI correction circuit 100 transmits the corrected data excluding the ECC code to the data buffer 209 through the buffer control circuit 207 by ECC block unit. The PI corrected data including the ECC code is also transmitted to the decoder 120 and is input to the PO operation circuit 121 and the PI operation circuit 122.

The PO operation circuit 121 performs the syndrome calculation in the PO direction (192 rows in a vertical direction) shown in FIG. 5 on each column of the input ECC block to store the calculation result for 182 columns. After the PO syndrome calculation for 1ECC is completed, the PO operation circuit 121 transmits the calculated data to the error polynomial operation circuit 123. The error polynomial operation circuit 123 generates the error correction code and the error position information in the 1ECC block. Further, the PI operation circuit 122 performs the syndrome calculation in the PI direction (182 bytes in a horizontal direction) shown in FIG. 5 on each row of the input ECC block to store the calculation result for 192 rows for a second PI correction process. The error correction code and the error position information in the 1ECC block generated by the error polynomial operation circuit 123 are transmitted to the address generation circuit 133.

The address generation circuit 133 generates the address on the data buffer 209 in which the uncorrected data that is to be corrected is stored based on the data stored in the address offset register 131, the data stored in the page size register 132, and the error position information in the 1ECC block generated in the error polynomial operation circuit 123. The address generation circuit 133 stores the generated address in the correction address buffer 135 and stores the error correction code in the correction data buffer 136.

The page boundary detection circuit 134 detects whether the generated address on the data buffer 209 has crossed the page boundary. The detection is performed as follows. The upper 7 bits (16-th bit to 10-th bit) of the generated address on the data buffer 209 is subtracted from the value of the upper 7 bits (16-th bit to 10-th bit) of the immediately preceding address on the data buffer 209. If the value is not zero, it is determined that the page boundary has been crossed. When the page boundary detection circuit 134 detects that the page boundary has been crossed, the restoration part 130 rewrites the data stored in the data buffer 209.

First, the restoration part 130 reads out the address on the correction address buffer 135 and reads out the data (uncorrected data) on the data buffer 209 designated by the address through the buffer control circuit 207. Then the exclusive-OR operation is performed on the data which is read out and the error correction code stored in the correction data buffer 136 by the EXOR circuit 137. The operation result is written back to the same position on the correction data buffer 136. Next, a pointer for the correction address buffer 135 and the correction data buffer 136 is incremented and subsequent data are sequentially rewritten. When processing of the data for one page is completed, the restoration part 130 writes back the corrected data stored in the correction data buffer 136 to the data buffer 209.

Now the process for one page is completed. The restoration part 130 further repeats the same process for a rest of 32 pages to complete the PO correction process for 1ECC. The error position information and the error correction code are sequentially transmitted from the error polynomial operation circuit 123 even during the PO correction process. The restoration part 130 sequentially stores the transmitted error position information and the error correction code in the next successive area on the correction address buffer 135 and the correction data buffer 136. The time needed to rewrite data for one page in the data buffer 209 is shorter than the time needed to receive data of the next one page. Therefore, the correction address buffer 135 and the correction data buffer 136 only need to have a size for two pages at most.

Now, a operation for storing the error correction code in the correction data buffer 136 will be described in detail. For example, after the error correction code for the first page in the data buffer 209 is stored in the correction data buffer 136, the error correction code for the next page is stored following the error correction code that has already been stored in the correction data buffer 136. For example, if we assume that there are six errors in the first page and five errors in the second page, the error correction code for the first page is stored in the 0-th address to 5-th address in the correction buffer and the error correction code for the second page is stored in the successive 6-th address to 10-th address in the correction buffer. Note that the correction address buffer 135 also stores the address on the data buffer 209.

When the PO corrected data is written back to the data buffer 209, the corrected data is also transmitted to the PI operation circuit 122. The PI operation circuit 122 compensates the operation result stored in the PI operation circuit 122 based on the PO corrected data. After all the operation results are compensated, the PI operation circuit 122 transmits the corrected syndrome calculation result to the error polynomial operation circuit 123. The error polynomial operation circuit 123 generates the error correction code and the error position information in the 1ECC block. The generated error position information and the error correction code are transmitted to the address generation circuit 133. Then the error polynomial operation circuit 123 starts the second PI correction.

The address generation circuit 133 generates the address on the data buffer 209 in which the data that is to be corrected is stored based on the data stored in the address offset register 131, the data stored in the page size register 132, and the error position information in the 1ECC block generated by the error polynomial operation circuit 123. The address generation circuit 133 stores the generated address in the successive area in the correction address buffer 135 and stores the error correction code in the successive area in the correction data buffer 136.

When the page boundary detection circuit 134 detects that the page boundary has been crossed, the restoration part 130 rewrites the data stored in the data buffer 209. The restoration part 130 reads out the address stored in the correction address buffer 135 and reads out the data stored in the data buffer 209 designated by this address. The restoration part 130 performs the exclusive-OR operation on the data which is read out and the error correction code stored in the correction data buffer 136 by the EXOR circuit 137 and writes back the operation result to the same position on the correction data buffer 136. When processing of the data for one page is completed, the restoration part 130 writes back the corrected data stored in the correction data buffer 136 to the data buffer 209.

Now the process for one page is completed. The restoration part 130 further repeats the same process for the rest of 32 pages to complete the PI correction process for 1ECC.

Figure 2:
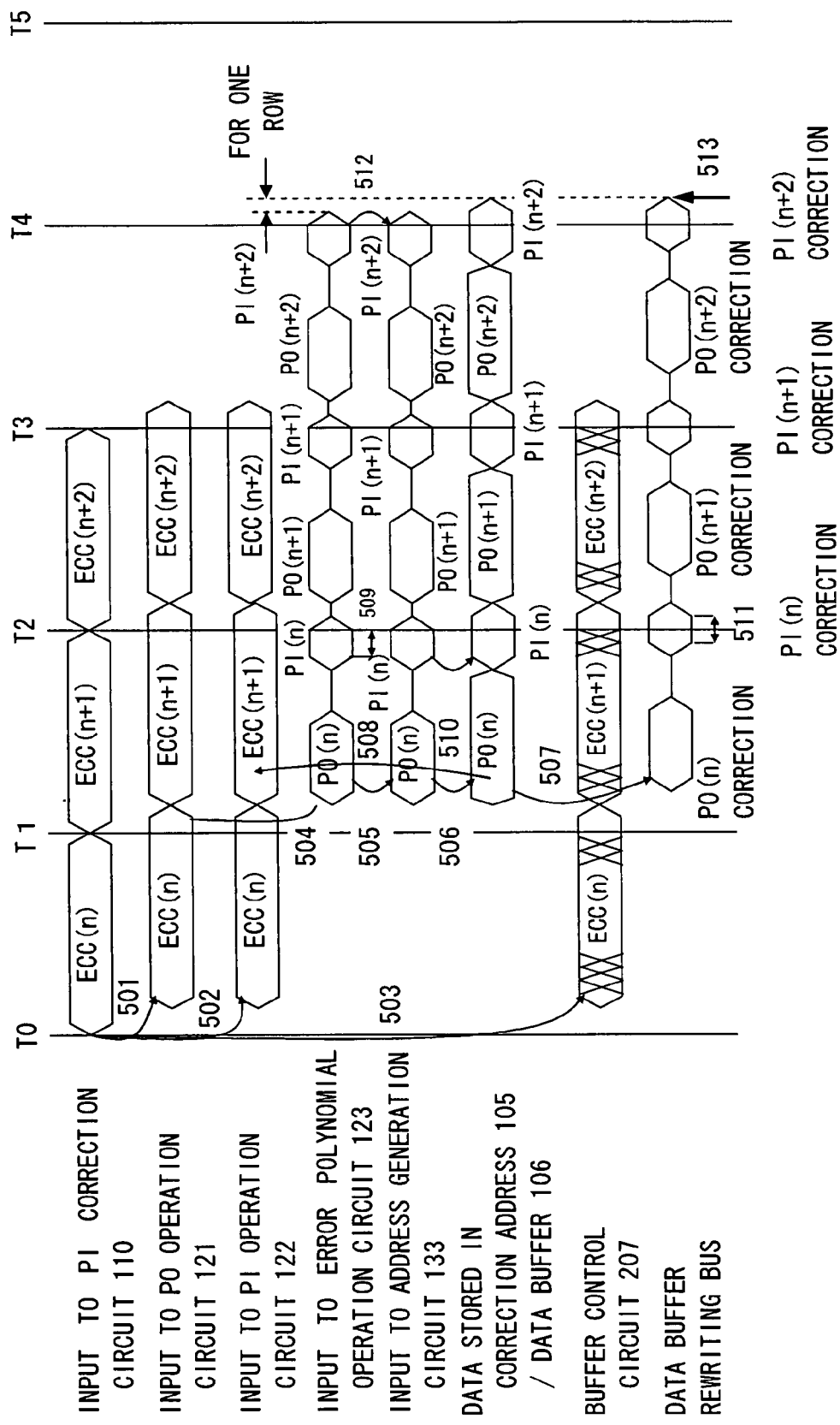
FIG. 2 is a timing chart of an error correction process according to the first embodiment.

Now, a data flow will be described with reference to FIG. 2. FIG. 2 is a timing chart of the error correction process according to the first embodiment. T0 to T5 indicate time. After PI correction is performed on the data input from the format control circuit 208 to the PI correction circuit 110, the PI corrected data is transmitted to the PO operation circuit 121, the PI operation circuit 122, and the buffer control circuit 207 (501, 502, 503). After the data for 1ECC is transmitted, the operation result obtained from the PO operation circuit is input to the error polynomial operation circuit 123 (504). The error correction code and the error position information detected by the error polynomial operation circuit 123 are input to the address generation circuit 133 (505). The error position information is converted into the address on the data buffer in the address generation circuit 133 and the address is stored in the correction address buffer 135. The error correction code is stored in the correction data buffer 136 so that the error correction code corresponds to the converted address (506). Hereinafter, and in FIG. 2, the correction address buffer 135 and the correction data buffer 136 will be called correction address/data buffer 135 and 136.

When the address on the data buffer and the error correction code for one page are stored in the correction address/data buffers 135 and 136, the error correction code and the address on the data buffer are read out and the data on the data buffer 209 is rewritten by the data buffer rewriting bus (buffer control circuit 207) (507). The rewritten data is also transmitted to the PI operation circuit 122 (508). The operation result is compensated in the PI operation circuit 122 using the rewritten data. After the process for rewriting the PO for 1ECC is completed, the PI operation circuit 122 inputs the compensated operation result to the error polynomial operation circuit 123 (509). The error position information and the error correction code detected in the error polynomial operation circuit 123 are input to the address generation circuit 133.

The address generation circuit 133 generates the error correction code and the address on the data buffer 209 and the generated address and error correction code are stored in the correction address/data buffers 135 and 136 (510). After the error correction code and the address on the data buffer 209 for one page are stored in the correction address/data buffers 135 and 136, the restoration part 130 reads out the error correction code and the address on the data buffer 209 and rewrites the data on the data buffer 209 by the data buffer rewriting bus (buffer control circuit 207) (511). After all the data for 1ECC are rewritten, the correction process for 1ECC is completed.

When processing of all the ECC is completed by repeating above-described process, the error correction process is completed. The PI correction process for the last data is completed when the process for rewriting of the data buffer 209 for one page is completed (513) after the last error position information and the error correction code are transmitted from the error polynomial operation circuit 123 (512).

Figure 4:
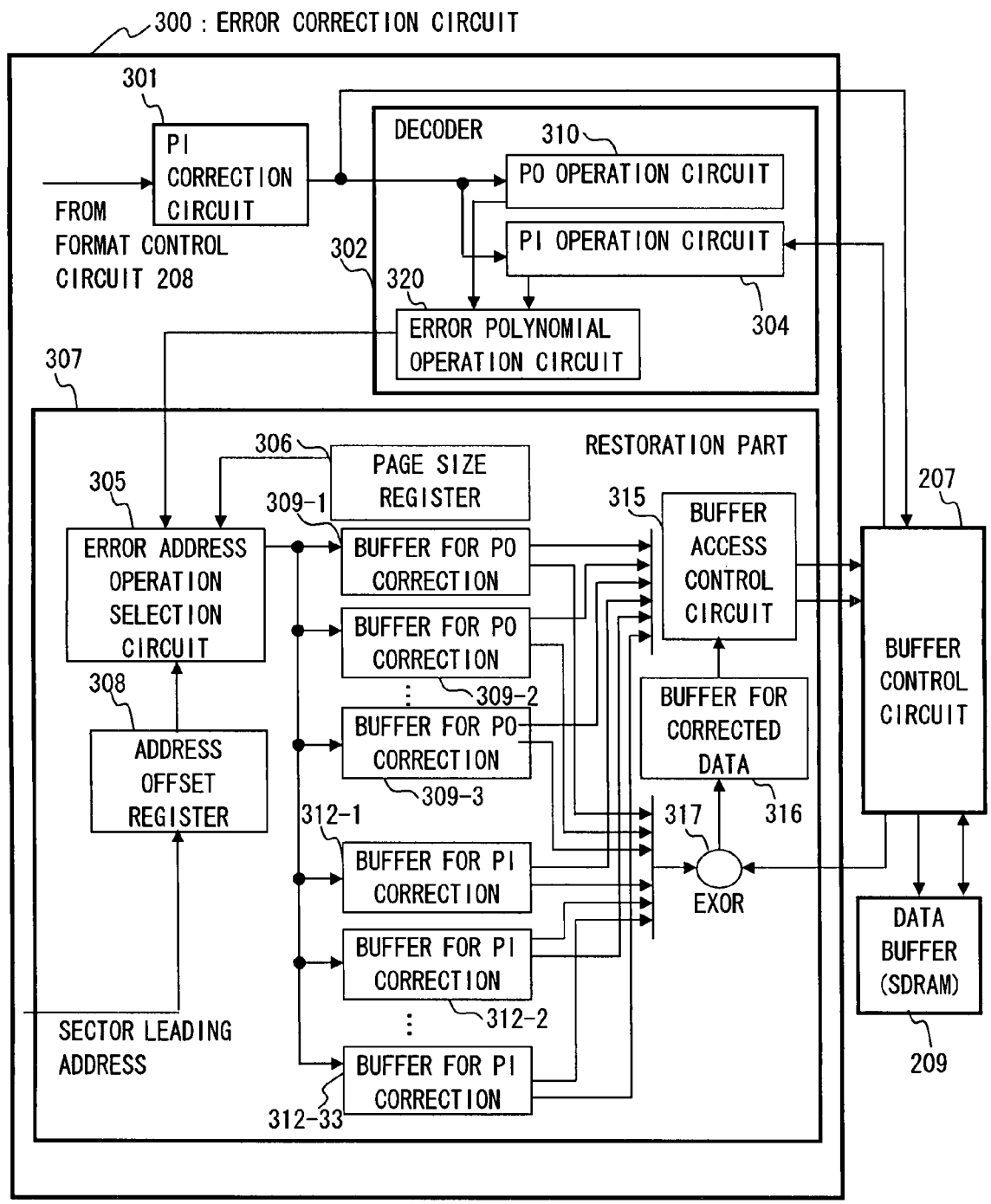
FIG. 4 is a block diagram showing a configuration example of a background error correction circuit.

Referring now to FIGS. 1 and 4, a mechanism for solving the problems by this embodiment will be described. In the background art, rewriting of the data buffer 209 is started after storing the error position information and the error correction code from the error polynomial operation circuit 320 for 1ECC. Therefore, transmission time for 33 pages is needed from the time the last error position information and error correction code are transmitted to the time the error correction process is completed. On the other hand, the page boundary detection circuit 134 is provided in the present embodiment. When the page boundary detection circuit 134 detects that the page boundary has been crossed, rewriting of the data stored in the data buffer 209 is started. Therefore, the PI correction process for the last data is completed when the process for one page is completed after the error polynomial operation circuit 123 transmits the last error position information and the error correction code. Therefore, in the present embodiment, the time needed from transmitting the last error position information and the error correction code to completing the error correction process can be reduced by 1/33.

Further, in the background art, the error position information and the error correction code from the error polynomial operation circuit 320 for 1ECC are stored, which requires 33 buffers. Moreover, another pair of buffers (33 buffers) is needed because the next data is input while the data corrected by the PO operation circuit 121 is rewritten. Therefore, 66 buffers in total are needed in the background art (the buffers for PO correction 309-1 to 309-33 and the buffers for PI correction 312-1 to 312-33 in FIG. 4). Note that this buffer corresponds to 66 pages because one buffer is allocated to one page of the data buffer 209. On the other hand, the page boundary detection circuit 134 is provided in the present embodiment. When the page boundary detection circuit 134 detects that the page boundary has been crossed, rewriting of the data stored in the data buffer 209 is started, which makes it possible to form the buffer only having the size (capacity) for two pages. Therefore, the area of the buffer for correction that is needed is reduced by 2/66.

Further, there is provided the dedicated buffer for corrected data 316 for storing the corrected data. On the other hand, the dedicated buffer for corrected data 316 is not needed in the present embodiment because the corrected data is written back to the same place on the correction data buffer 136.

As stated above, the capacity of the buffer can be reduced according to the error correction circuit of the present embodiment. Therefore, it is possible to decrease the area of the device needed for the error correction circuit. Further, by writing the corrected data into the data buffer 209 every time the error correction process is performed for one page, it is possible to reduce the process time compared with the background art in which the corrected data for 1ECC block is collectively overwritten.

Second Embodiment

In the second embodiment, description will be made on a case where the disc of the HD DVD (High Definition DVD) is read out in the disc device. The system configuration is the same as that in the first embodiment. Therefore, the overlapping description is omitted.

The format control circuit 208 processes the data (uncorrected data) read out from the recording media to the data having 364 bytes*208 rows in the HD DVD. The data having 364 bytes*208 rows is called ECC block and the error correction process of the HD DVD is performed by this ECC block unit. The data from 173-rd byte to 182-nd byte and the data from 355-th byte to 364-th byte of each row are called PI, and the data from 193-rd row to 208-th row of each ECC block is called PO. The 20 bytes of each row and the last 16 rows of each ECC block are called ECC code. The data of 344 bytes*192 rows excluding ECC code is the actual data.

The number of pages needed to store the data for 1ECC in the data buffer 209 can be calculated by dividing the data for 1ECC by the number of bytes in one page. Specifically, the data length excluding the ECC code is 344 bytes*192 rows and capacity for one page is 1024 (512*2) bytes. Therefore, the number of pages is 65 pages as shown in equation 2.

$$344 \text{ bytes}*192 \text{ rows}/1024 \text{ bytes}=64.5 \text{ pages} \quad (\text{eq. 2})$$

In the background art as shown in FIG. 4, 65 buffers for PO correction and 65 buffers for PI correction are needed. One buffer for PO correction and one buffer for PI correction are allocated to one page on the data buffer 209 to facilitate transmitting of the data to the data buffer SDRAM. Therefore, 65 buffers for PO correction and 65 buffers for PI correction are needed to be provided for 1ECC. However, by forming the error correction circuit as in the first embodiment, the correction data buffer 136 only needs to have capacity of two pages.

When the error correction circuit 100 shown in FIG. 1 is applied to the HD DVD format, the time needed from completing the error detection process to completing the error correction process can be reduced by 1/65 compared with the background art. The number of buffers can also be reduced by 2/130. In the background art, the corrected data is stored in the dedicated buffer for corrected data 316. In the present invention, the dedicated buffer for corrected data 316 is not needed because the corrected data is written back to the same position on the correction data buffer.

As stated above, according to the preferred embodiment of the present invention, the time needed from transmitting the last error position information and error correction code to completing the error correction process can be reduced. For example, if the 1ECC block has 33 pages, time can be reduced by 1/33, which is 1/the number of pages of 1ECC block. Therefore, it is possible to process the error correction more rapidly to realize the high-speed disc device.

In the preferred embodiment of the present invention, smaller error correction circuit can be realized because the correction data buffer or the correction address buffer only needs to have the size for two pages. Therefore, it is possible to realize smaller LSI (Large Scale Integration).

Further, according to the preferred embodiment of the present invention, the following point is improved. The PI correction process of the data of the last page of 1ECC block is completed when the process for rewriting of the data buffer 209 for the number of pages of 1ECC block (33 pages in the first embodiment) is completed after the error polynomial operation circuit transmits the last error position information and the error correction code. In the background address operation selection circuit shown in FIG. 4, the transmitted error position information is converted into the address on the data buffer and allocated to the buffer prepared by page unit. Therefore, it is impossible to process data at high speed. On the other hand, in the address generation circuit 133 shown in FIG. 1, the transmitted error position information is converted into the address on the data buffer and is successively stored in the correction address buffer. Therefore, it is possible to realize the high-speed data process.

Further, in the restoration part 307 shown in FIG. 4, the data buffer is rewritten after data transferring for 1ECC is completed. On the other hand, in the restoration part 130 shown in FIG. 1, rewriting of the data buffer 209 is started when the page boundary has been crossed. Therefore, it is possible to shorten process time for whole error correction process.

Moreover, in the restoration part 307 shown in FIG. 4, the data, obtained by performing the exclusive-OR operation on the data read out from the data buffer, is stored in the buffer for corrected data. On the other hand, in the restoration part 130 shown in FIG. 1, the data, obtained by performing the exclusive-OR operation on the data read out from the data buffer, is written back to the correction data buffer 136. Therefore, extra buffer for storing the corrected data is not needed, which makes it possible to reduce buffer capacity.

Further, in the background art, data buffer for correction is a single port type. It is impossible to write the next error data during correction. On the other hand, the correction data buffer 136 shown in FIG. 1 is two-port type, which makes it possible to write the next error data even during correction. Therefore, the error correction code and the corrected data can concurrently be written into the correction data buffer.

The restoration part 307 shown in FIG. 4 has pairs of buffers for correction, and the pair of buffers for correction alternately stores data. On the other hand, in the restoration part 130 shown in FIG. 1, the data is successively stored in one buffer for correction (correction address buffer 135 or correction data buffer 136). By having such a structure, it is possible to realize data transfer in high speed.

It is apparent that the present invention is not limited to the above embodiments, but may be modified and changed without departing from the scope and spirit of the invention.

What is claimed is:

1. An error correction device comprising:
   a temporary storage buffer having a storage area divided into a plurality of units and storing uncorrected data divided into storage area units; and
   an error correction part detecting an error of the uncorrected data stored in the temporary storage buffer, correcting the detected error and writing the corrected data into the temporary storage buffer for each storage area unit, and repeating the detecting, the correcting and the writing, wherein the temporary storage buffer includes the storage area divided into a plurality of pages accessed by page unit, the storage area being divided into the plurality of page units; and the error detection part comprises a detection part, and rewriting of data stored in the temporary storage buffer is started upon the detection part detecting the timing in which a position on the temporary storage buffer storing the uncorrected data has crossed a page boundary.

2. The error correction device according to claim 1, wherein the error correction part includes:

a correction address buffer storing error position information identifying the uncorrected data whose error is detected, wherein the detection part detects timing in which an error of the uncorrected data stored in one storage area unit is detected; and a correction data buffer storing an error correction code correcting the error of the uncorrected data identified by the error position information and overwriting the corrected data corrected based on the error correction code and the error position information in an area where the error correction code is stored in a timing detected by the detection part, and wherein the temporary storage buffer stores the corrected data overwritten in the correction data buffer.

3. The error correction device according to claim 2, wherein the correction data buffer includes a first area and a second area, the first area and the second area formed to be able to store two storage area units, the correction data buffer overwrites the corrected data in the first area and stores another error correction code of another uncorrected data in the second area when the timing is notified by the detection part, and the temporary storage buffer stores the corrected data overwritten in the first area.

4. The error correction device according to claim 3, wherein the temporary storage buffer stores the corrected data after the corrected data for the storage area unit is overwritten in the correction data buffer.

5. A recording and reproducing device comprising:

a reading part reading out uncorrected data from a recording media; and an error correction device according to claim 1.

* * * * *